US012628607B2

(12) United States Patent
Yoshida et al.

(10) Patent No.: US 12,628,607 B2
(45) Date of Patent: May 12, 2026

(54) OPTICAL HEATING DEVICE WITH ANGLED LIGHT HOLDING SUBSTRATE AND METHOD OF HEATING TREATMENT THEREOF

(71) Applicant: Ushio Denki Kabushiki Kaisha, Tokyo (JP)

(72) Inventors: Tomonori Yoshida, Tokyo (JP); Takahiro Inoue, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 557 days.

(21) Appl. No.: 18/159,590

(22) Filed: Jan. 25, 2023

(65) Prior Publication Data

US 2023/0238259 A1 Jul. 27, 2023

(30) Foreign Application Priority Data

Jan. 26, 2022 (JP) ................................. 2022-010007
Mar. 28, 2022 (JP) ................................. 2022-051454

(51) Int. Cl.
*H10P 72/00* (2026.01)
*H05B 3/00* (2006.01)
*H10P 34/42* (2026.01)

(52) U.S. Cl.
CPC ....... *H10P 72/0436* (2026.01); *H05B 3/0047* (2013.01); *H10P 34/422* (2026.01); *H05B 2203/032* (2013.01)

(58) Field of Classification Search
CPC ........... H01L 21/67115; H01L 21/2686; H01L 21/67259; H05B 3/0047; H05B 2203/032;
(Continued)

(56) References Cited

U.S. PATENT DOCUMENTS

2010/0090130 A1* 4/2010 Ganapathisubramanian ...............
G03F 9/7042
250/492.1
2019/0318946 A1 10/2019 Kim
(Continued)

FOREIGN PATENT DOCUMENTS

JP 2012-505544 A 3/2012
JP 2020-009927 A 1/2020
(Continued)

OTHER PUBLICATIONS

"Notice of Reasons for Refusal" Office Action issued in JP 2022-010007; mailed by the Japanese Patent Office on Jun. 18, 2025.

*Primary Examiner* — John P. Dulka
(74) *Attorney, Agent, or Firm* — Studebaker Brackett PLLC

(57) ABSTRACT

The invention provides an optical heating device and method of heating treatment capable of adjusting the illuminance distribution on the main surface of a substrate to be treated more precisely. An optical heating device that heats a substrate to be treated by irradiating light, the optical heating device includes; a support member supporting the substrate to be treated; and a light source unit including a plurality of LED substrates each having a first main surface on which a plurality of LED elements are mounted; in which at least one of the plurality of LED substrates is arranged such that the first main surface is inclined to the second main surface of the substrate to be treated when the substrate to be treated is supported by the support member.

9 Claims, 9 Drawing Sheets

(58) Field of Classification Search
CPC . H10P 72/0436; H10P 34/422; H10P 72/0606
See application file for complete search history.

(56) References Cited

U.S. PATENT DOCUMENTS

| 2020/0013645 A1 | 1/2020 | Gouda |
| 2022/0015213 A1 | 1/2022 | Kitagawa et al. |

FOREIGN PATENT DOCUMENTS

| JP | 2022-015867 A | 1/2022 |
| WO | 2010/042141 A2 | 4/2010 |

* cited by examiner

OPTICAL HEATING DEVICE WITH ANGLED LIGHT HOLDING SUBSTRATE AND METHOD OF HEATING TREATMENT THEREOF

CROSS-REFERENCE TO RELATED APPLICATION

The present invention claims the benefit of priority to Japanese Patent Application No. 2022-010007 filed on Jan. 26, 2022, and No. 2022-051454 filed on Mar. 28, 2022 with the Japanese Patent Office, the entire contents of which are incorporated herein by reference in its entirety.

BACKGROUND OF THE INVENTION

Field of the Invention

The present invention relates to an optical heating device and a method of heating treatment.

Description of the Related Art

A semiconductor production process includes various heat treatments applied to a substrate to be treated such as a semiconductor wafer, including depositing, oxidizing and diffusing, reforming, or annealing. These treatments are often performed by a method of heating treatment through light irradiation, which allows for contactless treatment.

As a device for heating a substrate to be treated, there has been known a device provided with a lamp such as a halogen lamp or a solid light source such as an LED and configured to irradiate the substrate to be treated with light for heating (hereinafter, occasionally called "heating light"). For example, Patent Document 1 describes a heating apparatus equipped with a plurality of LEDs.

PRIOR ART DOCUMENT

Patent Document

Patent Document 1: JP-A-2020-009927

SUMMARY OF THE INVENTION

In recent years, technological developments such as the miniaturization of semiconductor manufacturing processes have led to a demand for heating equipment capable of more uniform heat treatment. Therefore, the inventor has been diligently studying a heating device that can heat treat substrates to be treated with a more uniform temperature distribution and has found that the following issues exist.

As in the heating device described in Patent Document 1 above, a heating device in which a plurality of solid-state light sources such as LEDs are mounted as light sources emitting light for heating, the plurality of solid-state light sources are arranged on a plane parallel to the main surface of the substrate to be treated placed on a support member. The reasons why such a configuration is generally adopted include the fact that it is easier to predict and examine the illuminance distribution on the main surface of the substrate to be treated by aligning the separation distance between the main surface of the substrate and each solid-state light source, and it is also easier to control the illuminance distribution on the main surface of the substrate to be treated.

However, when a plurality of solid-state light sources are soldered or otherwise fixed to the main surface of the substrate on which the solid-state light sources are mounted, it is difficult to change the position of each solid-state light source later. Therefore, in a heating device based on mounting a plurality of solid light sources on a plane parallel to the main surface of a substrate placed on a support member, the only way to fine-tune the illuminance distribution on the main surface of the substrate to be treated was to move to parallel the substrate on which the solid light sources were fixed.

However, the arrangement of the plurality of solid light sources does not change when the solid light sources are moved in parallel with the substrate to which they are fixed. Therefore, depending on the position where the substrate is moved, the configuration of the solid-state light source arrangement may be inappropriate. If the solid-state light source is moved parallel to the substrate in a direction perpendicular to the substrate's main surface, the light emitted from the solid light source is irradiated onto the substrate before it spreads sufficiently, resulting in uneven irradiation.

If the solid-state light source is too far away from the substrate to be treated, the light cannot provide sufficient illumination due to insufficient illumination. In other words, it was difficult for conventional heating devices to finely adjust the illuminance distribution of light irradiated to each substrate to be treated.

In view of the above problem, it is an object of the present invention to provide an optical heating device and method of heating treatment capable of adjusting the illuminance distribution on the main surface of a substrate to be treated more precisely.

An optical heating device according to the present invention is an optical heating device that heats a substrate to be treated by irradiating light, the optical heating device includes:

a support member supporting the substrate to be treated; and a light source unit including a plurality of LED substrates each having a first main surface on which a plurality of LED elements are mounted; wherein at least one of the plurality of LED substrates is arranged such that the first main surface is inclined to a second main surface of the substrate to be treated when the substrate to be treated is supported by the support member.

In the present specification, "inclination" means a state in which the angle between the first main surface and the second main surface is within a range greater than 0° and less than 90°.

The angle between the first main surface of the LED substrate and the second main surface of the substrate to be treated supported by the support member can be continuously adjusted by adjusting the position of the LED substrate. When inclining the first main surface of the LED substrate to the second main surface of the substrate to be treated, the axis of rotation when rotating the LED substrate and the direction in which the LED substrate is inclined are arbitrary.

The optical heating device in the above configuration can continuously adjust the illuminance distribution on the main surface of the substrate to be treated by adjusting the direction in which the LED substrate is inclined, in addition to adjustment by the arrangement of LED elements on the first main surface of the LED substrate. In other words, the optical heating device in the above configuration can adjust illuminance distribution on the second main surface of the substrate to be treated more precisely than the conventional configuration.

In the above optical heating device, the plurality of LED substrates may include LED substrates arranged so that the first main surface is inclined to the second main surface of the substrate to be treated supported by the support member, and the plurality of LED substrates are arranged so that the first main surfaces are mutually non-parallel at least in part.

When viewed from a direction perpendicular to the main surface (second main surface) of the substrate to be treated, the temperature of the substrate during heating tends to decrease as it moves outward from the center, i.e., closer to the peripheral edge, compared to the area closer to its center position (the center). As mentioned above, when the substrate to be treated is a semiconductor wafer, in the case of heat treatment during the deposition process, a process gas is introduced during the treatment. In addition, a cleaning process may be performed on the semiconductor wafer between multiple processes. Thus, when a prescribed gas (e.g., processing gas) or solution (e.g., cleaning solution) is brought into contact with the substrate to be treated, the temperature in a specific area tends to decrease, and there is a possibility that the temperature distribution may become uneven. Therefore, to heat the substrate to be treated with uniform temperature distribution, it is preferable to adjust the angle between the first main surface of each of the plurality of LED substrates and the second main surface of the substrate to be treated individually according to the light irradiation position on the substrate to be treated.

The optical heating device with the above configuration can individually adjust the inclination angle of the first main surface of each of the plurality of LED substrates to the second main surface of the substrate to be treated. In other words, the respective inclination angles are optimized according to the position of each LED substrate and the desired light irradiation mode on the second main surface of the substrate. As a result, the illuminance distribution on the second main surface of the substrate can be adjusted more precisely.

In the above optical heating device, each of the plurality of LED substrates may be arranged so that an angle between the first main surface and the second main surface of the substrate to be treated is between 20° and 60° when the substrate to be treated is supported by the support member.

Furthermore, in the above optical heating device, each of the plurality of LED substrates may be arranged to satisfy formulae (1) to (3) below, wherein a separation distance between a center of the LED substrate at the first main surface and the substrate to be treated at the first main surface when the substrate to be treated is supported by the support member is Wd, a distance from a center of the substrate to be treated to the center of the LED substrate at the first main surface when viewed from a direction orthogonal to the second main surface of the substrate to be treated is Rd, the angle between the first main surface of the LED substrate and the second main surface of the substrate to be treated is θ.

$$60 \text{ mm} \le Wd \le 200 \text{ mm} \tag{1}$$

$$0.75 \le Rd/Wd \le 2.5 \tag{2}$$

$$\arctan(Rd/(2 \cdot Wd)) \le \theta \le \arctan(Rd/Wd) \tag{3}$$

The light emitted from the LED element has light distribution characteristics that follow $\cos \alpha$ in the range $-90° \le \alpha \le 90°$ when the emission angle of the light is $\alpha$. Such an optical characteristic is also referred to as "Lambertian light distribution". According to this optical characteristic, assuming that light intensity in the range $-90° \le \alpha \le 90°$ has an integral value of 100%, the integral value of light intensity in a range $-20° \le \alpha \le 20°$ is about 40% of the entirety, and the integral value (hereinafter, occasionally called "relative intensity ratio") of light intensity in a range $-60° \le \alpha \le 60°$ is about 90% of the entirety (see FIG. 5).

The relative intensity ratio is relevant to by which percent the integral value of light intensity changes in a region irradiated with light emitted from an LED element not being inclined when the LED element is inclined by an angle corresponding to the emission angle $\alpha$. Details will be explained with reference to FIG. 5 in "DETAILED DESCRIPTION OF THE PREFERRED EMBODIMENTS".

As described above, when the emitting surface of the LED element is inclined by 20° from the second main surface of the substrate to be treated, the integral value of light intensity in the light distribution changes by about 40%. When the light emission surface of the LED element is inclined more than 60° to the second main surface of the substrate to be treated, the integral value of light intensity changes by about 90% or more in light distribution. Therefore, the angle between the first main surface of the LED substrate and the second main surface of the substrate to be treated is preferably a range of 20° to 60°, based on the viewpoint of efficiently changing the illuminance distribution on the second main surface of the substrate and suppressing light waste.

Furthermore, an appropriate separation distance Wd (also referred to as "work distance") is preferably kept between the LED substrate and the substrate to be treated so that they do not come into contact with each other. To obtain a more uniform illuminance distribution, the separation distance Wd is also determined by taking into consideration such factors as the fact that the light emitted from the LED elements is irradiated to the substrate to be treated in a certain spread-out state.

The inventor of the present invention has further found that through diligent studies of a configuration enabling the inclination of an LED substrate, temperature distribution on the substrate to be treated being heated contributes directly to a ratio (also referred to as an "aspect ratio") between the distance Rd and the separation distance Wd expressed in formulae (2) and (3).

Details will be described in "DETAILED DESCRIPTION OF THE PREFERRED EMBODIMENTS" to be provided later, the optical heating device based on the above condition, the difference ($\Delta T$) between the maximum value and the minimum value in the temperature distribution relative to the average value ($T_{ave}$) in the entire temperature distribution is suppressed to 10% or less. Designing to satisfy formulae (1) to (3) to achieve such temperature distribution inevitably leads to optimizing illumination distribution on the second main surface determined to uniformly heat the substrate to be treated.

The above optical heating device may further include a frame provided thereon with the plurality of LED substrates.

Furthermore, the above optical heating device, the frame includes an angle adjusting mechanism configured to change the positions of the LED substrates to adjust the angle between the first main surface and the second main surface of the substrate to be treated supported by the support member.

With the above configuration, the LED substrate can be configured so that the angle between the first main surface of the LED substrate and the second main surface of the substrate to be treated becomes a predetermined angle determined in advance according to the substrate to be treated, simply by placing and fixing the LED substrate on the frame.

In the case of frames equipped with an angle adjusting mechanism, the incline angle of the LED substrate can be fine-tuned according to the type, size, shape, etc. of various substrates to be treated, as appropriate. In other words, the optical heating device in this configuration can more precisely adjust the illuminance distribution on the substrate to be treated and can perform a more uniform heating treatment.

In the above optical heating device, at least of the plurality of LED substrates may be arranged to satisfy formula (4) below, wherein an angle between the first main surface and the second main surface of the substrate to be treated under a condition that the substrate to be treated is supported by the support member is θ, a separation distance between the first LED element located closest from the second main surface to a normal direction of the second main surface and the substrate is D1, a separation distance between the first LED element mounted on the LED substrate and the second LED element located farthest from the second main surface to the normal direction is D2.

$$2 \tan 2\theta / \cos \theta \geq D2 / D1 \qquad (4)$$

In the present specification, the separation distance D1 between the LED element in the light source unit and the substrate to be treated is defined in accordance with the center on the light emission surface of the LED element and the separation distance from the substrate to be treated. The center on the light emission surface of the LED element may be a center of an inscribed circle at a peripheral edge of a region occupied by the LED element when the first main surface is viewed in a normal line direction of the first main surface of the LED substrate.

The angle θ between the first main surface of each of the LED substrates and the second main surface of the substrate to be treated supported by the support member can be continuously adjusted through positional adjustment of the LED substrate. When inclining the first main surface of the LED substrate to the second main surface of the substrate to be treated, the axis of rotation when rotating the LED substrate and the direction in which the LED substrate is inclined are arbitrary.

In the present specification, the separation distance between the first LED element and the second LED element is defined by the distance between the centers of the LED elements when viewed in a direction perpendicular to the first main surface of the LED substrate. In a case where a single light source unit includes a plurality of LED elements each corresponding to the first LED element and a plurality of LED elements each corresponding to the second LED element, the separation distance D2 corresponds to the shortest one of the separation distances between combinations of the first LED elements and the second LED elements.

The optical heating device in the above configuration can continuously adjust illumination distribution on the main surface of the substrate to be treated, by adjustment through the arrangement of the LED elements on the first main surface of the LED substrate as well as adjustment of the inclination angle θ of the LED substrate and the inclination direction of the LED substrate. In other words, the optical heating device in the above configuration can adjust illumination distribution on the second main surface of the substrate to be treated more precisely than any conventional configuration.

With the above configuration, a principal ray of light emitted from at least the LED element disposed closer to the second LED element than the first LED element among the LED elements included in the light source unit is, when being reflected on the second main surface of the substrate to be treated, travels toward outside the region provided with the LED elements on the LED substrate in the light source unit, or toward outside the light source unit.

The amount of light that is emitted from the LED element of the light source unit, reflected by the second main surface of the substrate to be treated, and then returned to the LED element or its vicinity is reduced. The LED elements mounted on the light source unit are suppressed from being heated by the light reflected from the second main surface of the substrate to be treated. The "principal ray" refers to the ray of light source that exhibits the highest intensity.

The relationship between the derivation of the above formula (4) and the effects of the above configuration will be described in detail with reference to the drawings in "DETAILED DESCRIPTION OF THE PREFERRED EMBODIMENTS".

The above optical heating device, the light source unit may include a first LED substrate that is inclined such that a normal line of the first main surface from the light source unit toward the substrate to be treated is directed toward a center portion of the substrate to be treated under the condition that the substrate to be treated is supported by the support member, and a second LED substrate that is inclined such that the normal line of the first main surface from the light source unit toward the substrate to be treated is directed toward a peripheral edge of the substrate to be treated.

The above optical heating device may further include an angle adjusting mechanism configured to adjust the angle θ by changing positions of the LED substrate.

The above optical heating device may further include a controller configured to determine a value of the angle θ based on the separation distance D1 and the separation distance D2, and drive the angle adjusting mechanism based on the determined angle θ.

The optical heating device in the above configuration can adjust the angle θ according to the shape of the substrate to be treated and the setting of the separation distance D1 in the heating treatment of the substrate to be treated.

Furthermore, the optical heating device in the above configuration can be configured, for example, such that the controller determines the angle θ that satisfies the conditions of the above formula (4) based on the predetermined values of the separation distance D1 and the separation distance D2, and automatically adjusts the position of the LED substrate to the optimal position.

For example, the method for determining the angle θ is to store a table created by calculating the optimum angle θ values for the combination of separation distance D1 and distance D2 in advance, and when the separation distance D1 and separation distance D2 are input, the corresponding angle θ value is selected from the table.

The optical heating device may further include an angle sensor configured to measure the angle θ between the first main surface and the second main surface.

The optical heating device in the above configuration can adjust the position of the light source unit and the like while checking whether or not the deposition of the light source unit satisfies the condition expressed by the above formula (4).

The optical heating device in the above configuration can also detect the condition that the light source unit no longer satisfies the condition of the above formula (4) in cases where the light source unit has been displaced due to a large impact.

In the optical heating device, the support member may include a rotation mechanism that rotates the substrate to be treated around an axis that is orthogonal to the second main surface and passes through a center of the second main surface.

The optical heating device in the above configuration can irradiate the substrate to be treated with heating light emitted from the light source unit while rotating the substrate to be treated mounted on the support member. By irradiating heating light while rotating the substrate to be treated, the amount of light irradiated to the second main surface of the substrate is uniformed in the circumferential direction on the second main surface. Therefore, uneven heating of the substrate to be treated is suppressed.

In the above optical heating device, the LED element mounted on the LED substrate emits light having a peak wavelength from 300 nm to 1000 nm.

Specifically, a semiconductor wafer made of silicon (Si) (hereinafter, called a "silicon wafer") has high absorptance for light in the wavelength range from ultraviolet light to visible light, and the absorptance rapidly decreases when the wavelength is longer than 1100 nm. As shown in FIG. 4 to be referred to in "DETAILED DESCRIPTION OF THE PREFERRED EMBODIMENTS", absorptance is about 50% or less when the silicon wafer is irradiated with light having a wavelength of 1100 nm or more.

As mentioned above, most objects do not absorb all of the irradiated light, but absorb a portion of said light and transmit or reflect the other portion. According to a graph shown in FIG. 4, when the silicon wafer is irradiated with light with a wavelength of 1100 nm, more than 50% of the irradiated light is transmitted or reflected without being absorbed.

If the reflectance of the substrate to be treated is high, the amount of light that is reflected by the second main surface of the substrate to be treated will be high. Therefore, the peak wavelength of the light emitted from the LED element is preferably 1000 nm or less, where the absorptance of the silicon wafer is 50% or more.

The silicon wafer has an absorptance of about 10% for light with a wavelength of less than 300 nm, which is significantly lower than the absorptance for light with a wavelength of about 1,000 nm. Therefore, to ensure an absorptance of at least 25%, the peak wavelength of the light emitted from the LED element is preferably 300 nm or more.

By adopting an LED element having a peak wavelength in the above wavelength range for the LED element mounted in the light source unit, the ratio of the amount of light reflected at the second main surface of the substrate to be treated is reduced in the light emitted from the light source unit and irradiated to the substrate to be treated. Therefore, it is possible to suppress the irradiation of heating light emitted from the LED elements and reflected by the substrate to the LED elements mounted on the light source unit.

Furthermore, in the optical heating device, the LED element mounted on the LED substrate emits light having a peak wavelength from 800 nm to 900 nm.

As shown in FIG. 4, silicon (Si) has a small change in absorptance in response to wavelength variation for light in the wavelength range from 800 nm to 900 nm. Therefore, by setting the wavelength range, uneven heating is suppressed even if the wavelength of the light irradiated in each irradiated area of the silicon wafer is slightly different.

Therefore, the optical heating device in the above configuration suppresses the influence of variations in the peak wavelength of light emitted from the LED elements in the silicon wafer heating process.

A method of heating treatment of the present invention is a heating treatment method in which a substrate to be treated supported by a support member is heated by irradiating light emitted from a light source unit including a plurality of LED substrates on which a group of LED elements are mounted on a first main surface of the substrate to be treated, and the method includes:

irradiating the substrate to be treated with heating light containing light emitted from the light source unit configured to satisfy formula (4) in a state where the substrate to be treated is supported by the support member, wherein θ is an angle between the first main surface and a second main surface of the substrate to be treated under a condition that the substrate to be treated is supported by the support member, D1 is a separation distance between the first LED element located closest from the second main surface to a normal direction of the second main surface and the substrate, D2 is a separation distance between a second LED element mounted on the LED substrate and the first LED element located farthest from the second main surface to the normal direction.

$$2 \tan 2\theta / \cos \theta \geq D2/D1 \tag{4}$$

The above method of heating treatment may include, determining the angle θ based on the separation distance D1 and the separation distance D2, and changing position of the LED substrate based on the determined the angle θ.

According to the present invention, an optical heating device is achieved that is capable of adjusting the illuminance distribution on the main surface of a substrate to be treated more precisely.

DETAILED DESCRIPTION OF THE PREFERRED EMBODIMENTS

An optical heating device and a method of heating treatment of the present invention will be described hereinafter with reference to the drawings. The optical heating device is shown schematically in each of the following drawings, in which dimensional ratios and the numbers of items do not necessarily conform to actual dimensional ratios and the actual numbers of items.

First Embodiment

Figure 1:
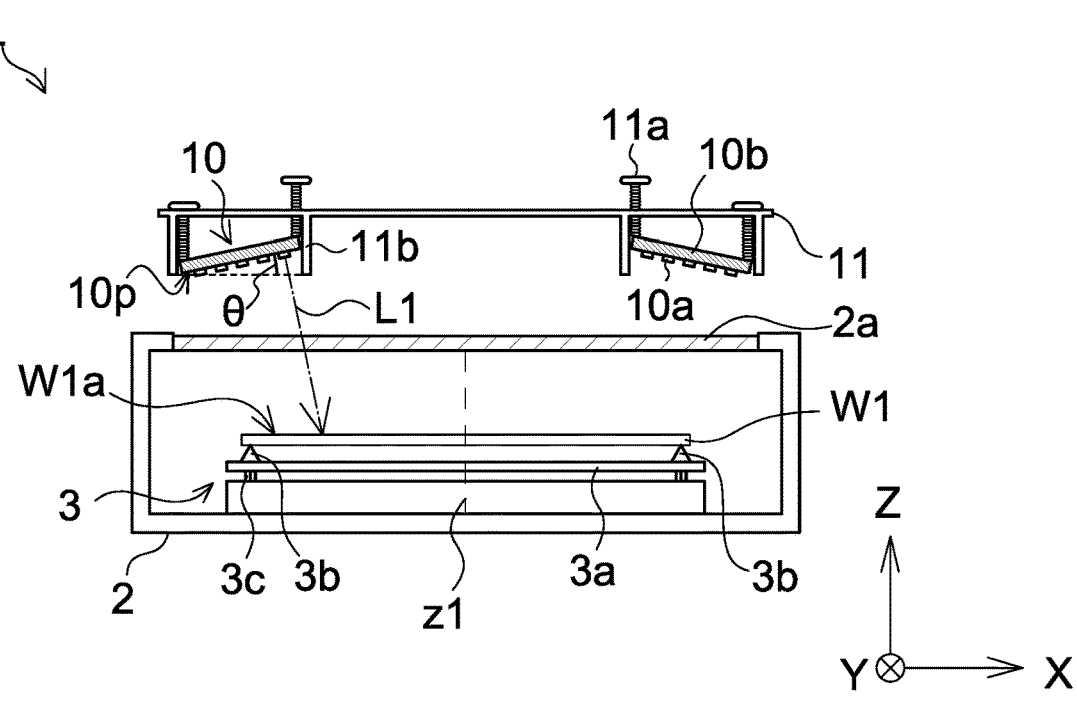
FIG. 1 is a schematic cross-sectional view in a Y direction, of an optical heating device according to an embodiment.

FIG. 1 is a schematic cross-sectional view in a Y direction, of an optical heating device 1 according to the first embodiment. As shown in FIG. 1, the optical heating device 1 includes a chamber 2 that accommodates a substrate to be treated W1, and a plurality of light source units 10 configured to irradiate the substrate to be treated W1 with heating light applied to heat the substrate to be treated W1 accommodated in the chamber 2. The plurality of light source units 10 is supported by a frame 11.

As shown in FIG. 1, the light source units 10 each include a plurality of LED elements 10a configured to emit light for heating, and an LED substrate 10b configured to be provided thereon with the plurality of LED elements 10a. FIG. 1 schematically shows only a principal ray L1 in light emitted from each of the LED elements 10a.

In the light source unit 10 of the first embodiment, a plurality of the LED elements 10a emitting infrared light with a peak wavelength of 850 nm are arranged on a first main surface 10p of the LED substrate 10b.

Figure 2:
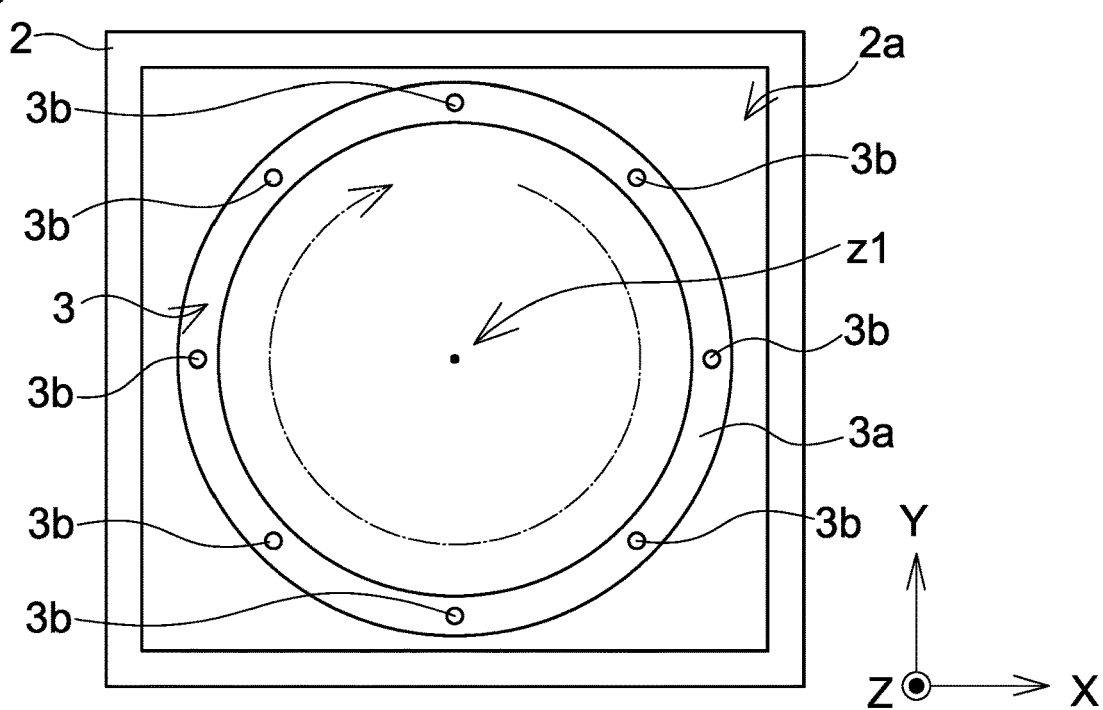
FIG. 2 is a view from a +Z side, of a chamber shown in FIG. 1.
Figure 3:
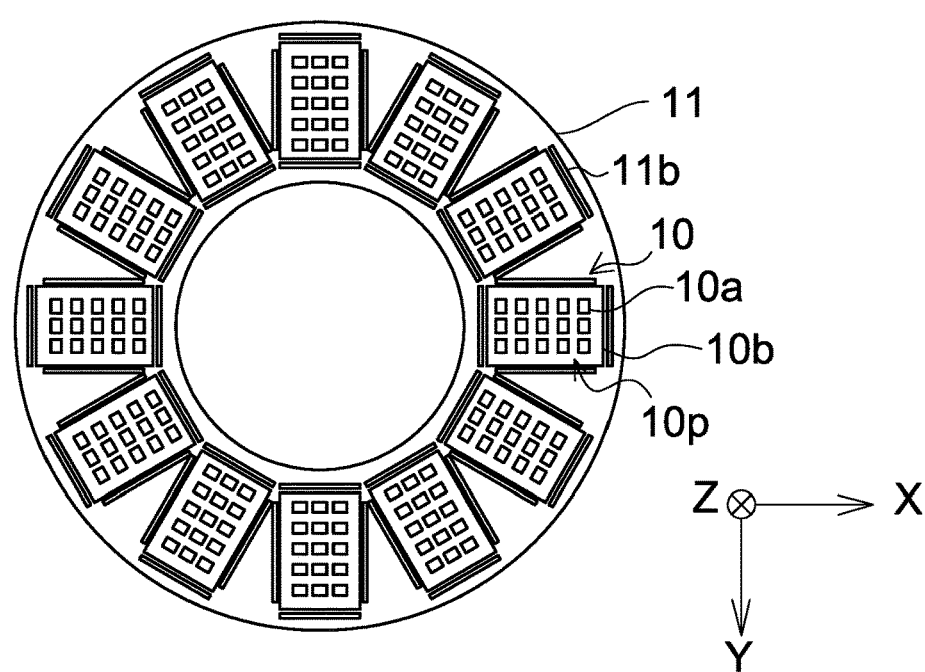
FIG. 3 is a view from a −Z side, of a frame shown in FIG. 1.

FIG. 2 is a view from a +Z side, of the chamber 2 shown in FIG. 1. FIG. 3 is a view from a −Z side, of the frame 11 shown in FIG. 1. In FIG. 2, the light transmissive window 2a, described below, is not hatched so that the structure inside chamber 2 can be seen.

In the following description, a plane parallel to a main surface (hereinafter, referred to as a "second main surface W1a") of the substrate to be treated W1 serving as a heating target accommodated in the chamber 2 is assumed as an XY plane As shown in FIG. 2, and a direction perpendicular to the XY plane is assumed as a Z direction as shown in FIG. 1.

Furthermore, positive and negative orientations distinguished from each other for directional expression will be described as a "+Z direction" and a "−Z direction" by adding positive and negative signs, while a direction expressed without distinction between positive and negative orientations will be described simply as the "Z direction".

In the description of the first embodiment, it is assumed that the substrate to be treated W1 is a silicon wafer. However, it is also assumed that the optical heating device 1 is used for the substrate to be treated W1 other than silicon wafers (e.g., glass substrates).

As shown in FIG. 1, the chamber 2 includes a support member 3 on which the substrate to be treated W1 is placed and a light transmissive window 2a to guide light emitted from the light source unit 10 to the inside of the chamber 2. The chamber 2 may not have the light transmissive window 2a in a case where the light source unit 10 is disposed of in the chamber 2, in a case where the interior of the chamber 2 does not need to be enclosed, or the like.

As shown in FIGS. 1 and 2, the support member 3 includes a base 3a, and a plurality of tips 3b is provided on the base 3a. The substrate to be treated W1 is placed on the plurality of tips 3b and supported. The support member 3 may be any member that can fix or hold the substrate to be treated W1 and may be configured to support the periphery of the substrate to be treated W1 or to support the substrate to be treated W1 by a non-contact suction type construction.

As shown in FIG. 1, the support member 3 according to the first embodiment is provided with a rotary mechanism including a plurality of rollers 3c. The substrate to be treated W1 is rotated by this roller 3c on the XY plane with the axis of rotation z1 (see FIG. 2) passing through the center of the support member 3 in the Z direction when the heat treatment is performed. If the light source unit 10 is configured to emit light uniformly in a circumferential direction of the second main surface W1a of the substrate to be treated W1, the support member 3 may not be configured to rotate the substrate to be treated W1. That is, whether or not the support member 3 includes rollers 3c is optional.

Figure 4:
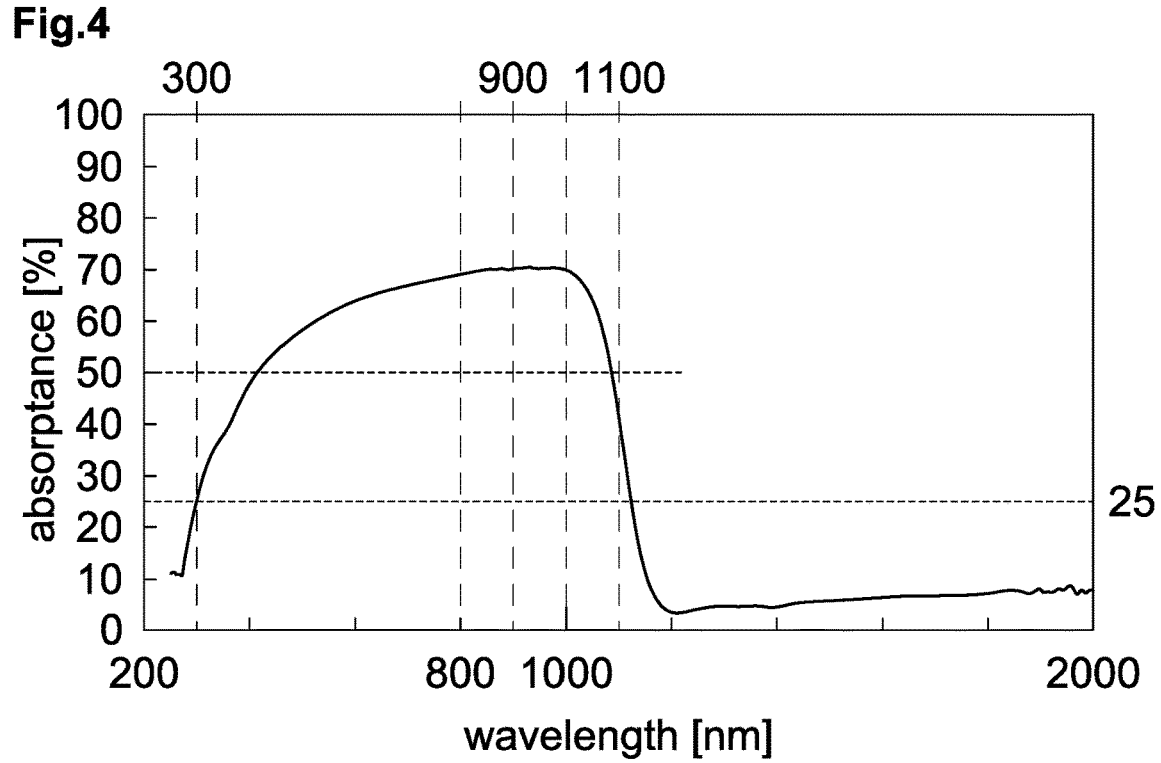
FIG. 4 is a graph showing a relationship between a wavelength and absorptance of light when temperature of silicon (Si) is 543 K.

FIG. 4 is a graph indicating a relationship between a wavelength and absorptance of light when a temperature of silicon (Si) is 543 K. The temperature of 543 K is selected because it is often around a target temperature when heating silicon wafers or in the process of heating up. Although the peak wavelength of light emitted from the LED elements 10a may be set arbitrarily, it is preferable from 300 nm to 1000 nm, and it is more preferable from 350 nm to 950 nm, because the light has absorptance of at least 25%, in other words, reflectance of at most 75% as shown in FIG. 4.

Furthermore, as shown in FIG. 4, silicon (Si) has small change in absorptance in response to wavelength variation of light having a wavelength from 800 nm to 900 nm. Therefore, it is further preferred that the light emitted from the LED element 10a in the light source unit 10 have a peak wavelength of between 800 nm and 900 nm to suppress uneven heating, and it is especially preferred that the peak wavelength is between 820 nm and 880 nm.

As shown in FIG. 1, the frame 11 in the first embodiment includes an adjustment screw 11a as an angle adjusting mechanism to adjust an angle θ of inclination of each of the light source units 10 to change an emission direction of the light emitted from the LED element 10a. As shown in FIGS. 1 and 3, the frame 11 is further provided with a support wall 11b to prevent the light source unit 10 from shifting position when its inclination is adjusted.

As shown in FIG. 1, the frame 11 is adjusted, by the adjustment screw 11a, such that the first main surface 10p of the LED substrate 10b in each of the light source units 10 is inclined by the angle θ from the XY plane. The angle adjusting mechanism may consist of, for example, a piezo actuator or a micrometer head with an encoder.

The light source unit 10 in the first embodiment is configured so that the angle θ is 45° when mounted on the frame 11. The angle θ may not be 45°, and the plurality of LED substrates 10b may each be arranged so that the angle θ formed by the first main surface 10p and the second main surface W1a of the substrate to be treated W1 is different, that is, the first main surfaces 10p of the plurality of LED substrates 10b are mutually non-parallel.

Figure 5:
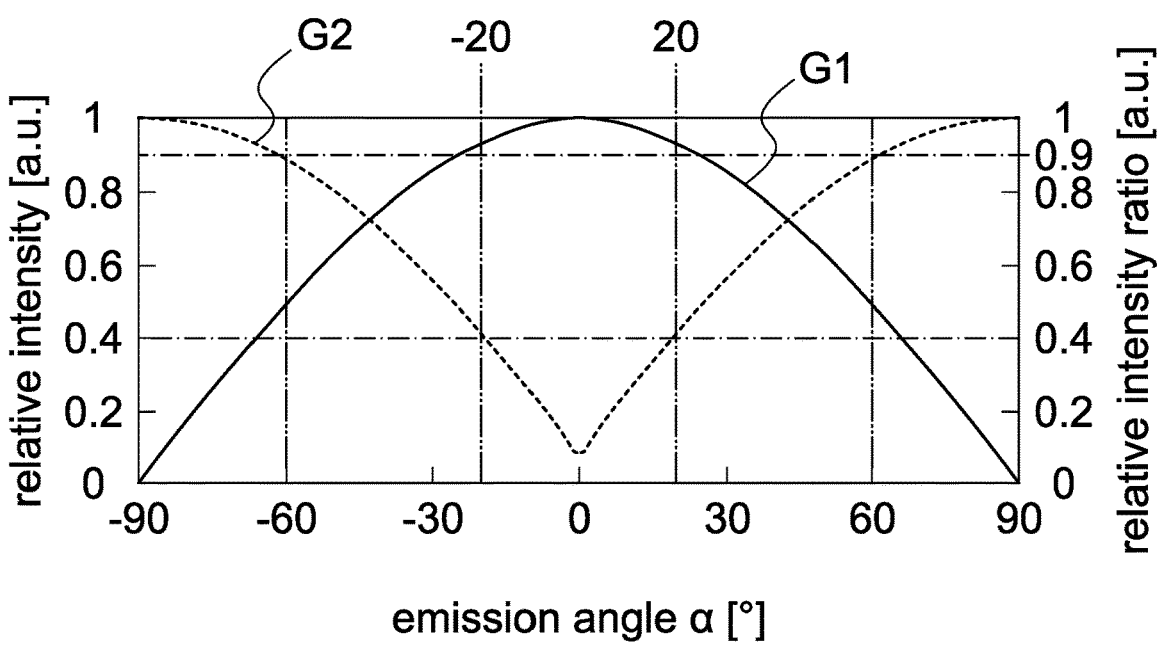
FIG. 5 is a graph showing relative intensity distribution of light emitted from an LED element and a relative intensity ratio in the distribution.

The setting of the angle θ is explained. FIG. 5 includes a graph G1 showing a relative relationship of light intensity for each emission angle of light emitted from an LED element, and a graph G2 indicating a relative value (relative intensity ratio) for each angle, of an integral value of light intensity from 0° to the emission angle α in the graph G1 relative to an integral value of light intensity in the range 0°≤α≤90° (−90°≤α≤0° in the range of the emission angle α having a negative value). The graphs in FIG. 5 have a horizontal axis indicating the emission angle α, a left vertical axis indicating the relative value of light intensity for the graph G1, and a right vertical axis indicating the relative intensity ratio for the graph G2.

An LED element is constituted by a laminate of semiconductor layers, and the uppermost or lowermost surface typically serves as a light output surface. As shown in FIG. 5, when the LED element is normalized with intensity of light emitted at the emission angle of 0° being assumed as one, intensity of light emitted at the emission angle α is known to have light distribution expressed as cos α. As to the light distribution, the integral value obtained by integrating light intensity from 0° to the emission angle α is in proportion to an absolute value of sin α because the integral value is the sum of light intensity and is obtained by an integral operation relating to α in cos α.

The graph G2 in FIG. 5 indicates, for each emission angle α, to which percent the integral value of light intensity in the range from the emission angle 0° to the emission angle α of light emitted from an LED corresponds to the integral value of light intensity in the range of the emission angle 0°≤α≤90° (−90°≤α≤0° in the range of the emission angle α having a negative value). Such a characteristic is relevant to by which percent the integral value of light intensity changes in a region irradiated with light emitted from the LED element 10a not being inclined when the LED element 10a is inclined by an angle corresponding to the emission angle α.

According to the graph G2 in FIG. 5, specifically when the LED element 10a has a light emission surface inclined by 20° from the second main surface W1a of the substrate to be treated W1, the integral value of light intensity changes by about 40% in the region irradiated with light emitted from the LED element not being inclined. When the light emission surface of the LED element 10a is inclined by 60° or more from the second main surface W1a of the substrate to be treated W1, the integral value of light intensity in the region changes by about 90% or more.

The angle θ between the first main surface 10p of the LED substrate 10b and the second main surface W1a of the substrate to be treated W1 is preferably in a range from 20° to 60°, based on the viewpoint of efficiently changing the illuminance distribution on the second main surface W1a of the substrate to be treated W1 and suppressing light waste.

The following describes a more preferable positional relationship between the light source unit 10 and the substrate to be treated W1 for more uniform temperature distribution on the substrate to be treated W1. When extremely high temperature uniformity is not required in the heat treatment of the substrate to be treated W1, such as a semiconductor wafer, the optical heating device 1 is not required to satisfy disposition conditions as follows.

Figure 6A:
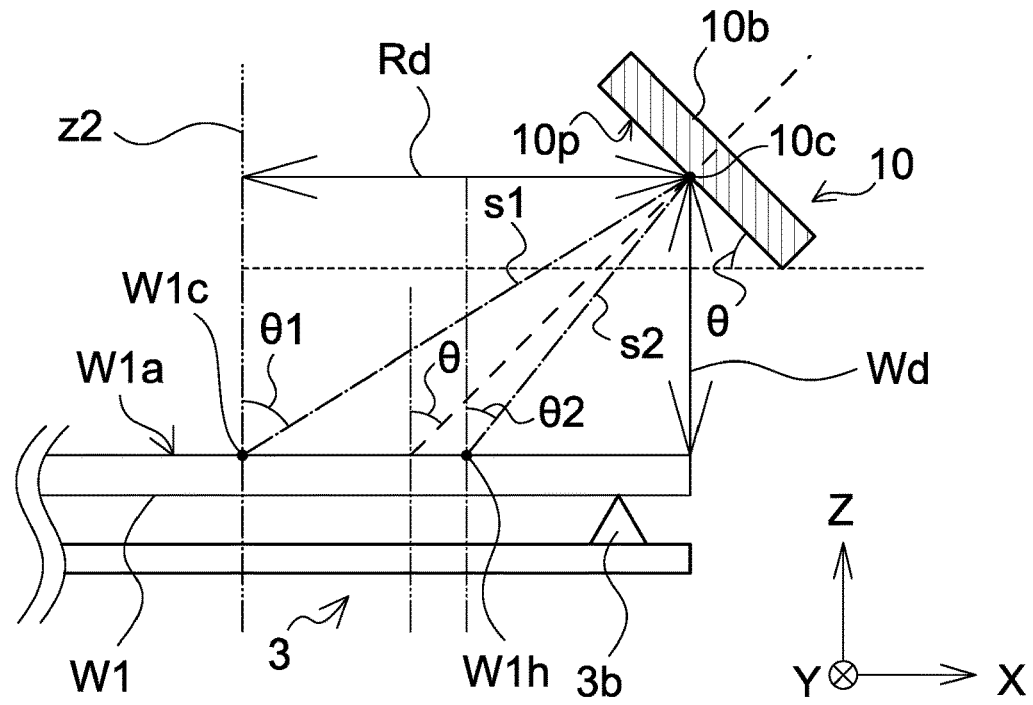
FIG. 6A is an explanatory schematic view of a configuration of a light source unit, and a disposition relationship between the light source unit and a substrate to be treated.
Figure 6B:
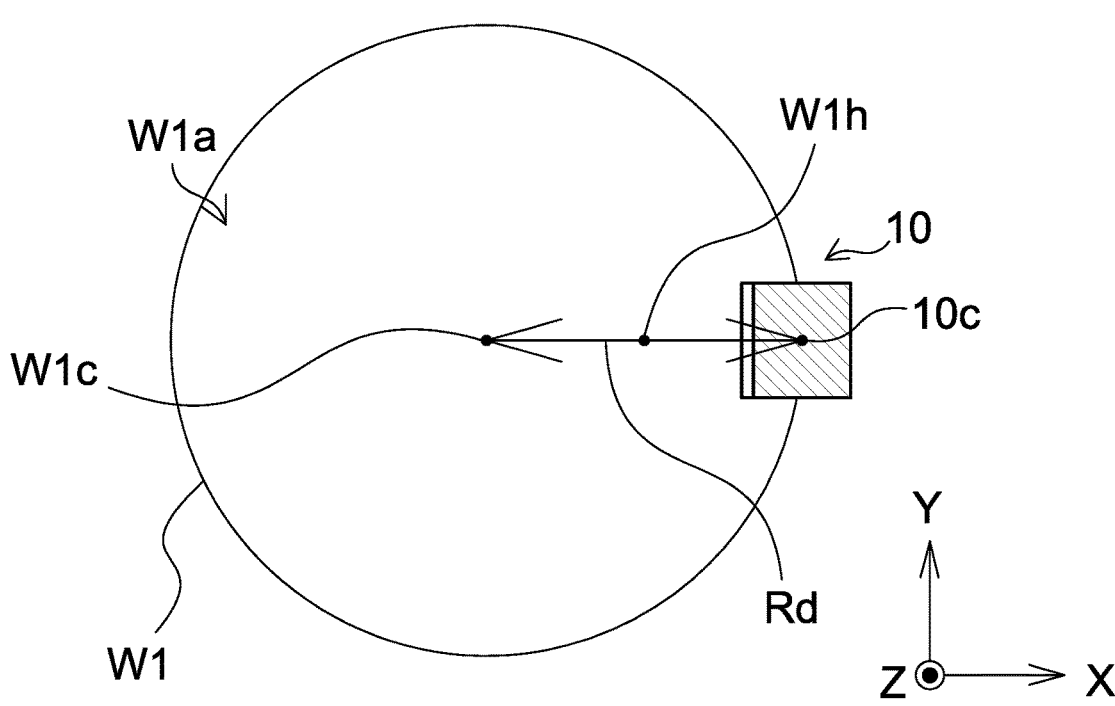
FIG. 6B is a view from the +Z side, of the light source unit and the substrate to be treated shown in FIG. 6A.

First, the separation distance between the light source unit 10 and the substrate to be treated W1 is explained. FIG. 6A is an explanatory schematic view of a configuration of the light source unit 10, and a disposition relationship between the light source unit 10 and the substrate to be treated W1. FIG. 6B is a view from the +Z side, of the light source unit 10 and the substrate to be treated W1 shown in FIG. 6A.

In the configurations shown in FIGS. 6A and 6B, for convenience of explanation, the angle θ between the first main surface 10p and the second main surface W1a, and the size ratio of the light source unit 10 to the substrate to be treated W1 are illustrated differently from FIG. 1, and only the area around the light source unit 10 is shown. Further, for convenience of explanation, the chamber 2 and the LED element 10a provided by the light source unit 10 are not shown in FIG. 6A.

As shown in FIG. 6A, in the light source unit 10, Wd is a separation distance between the center 10c of the first main surface 10p of the LED substrate 10b and the substrate to be treated W1, and Rd is a distance between the axis z2 passing through the center W1c of the substrate to be treated W1 in the Z direction and the center 10c of the light source unit 10.

The separation distance Wd is preferably set to satisfy the above formula (1) based on the inhibiting contact between the light source unit 10 being inclined and the substrate to be treated W1 and sufficiently irradiating the substrate to be treated W1 with light necessary for heating. To be sure, the above formula (1) is restated.

$$60 \text{ mm} \leq Wd \leq 200 \text{ mm} \tag{1}$$

In the first embodiment, the separation distance Wd is set to 100 mm, and the distance Rd is set to 150 mm.

Figure 7A:
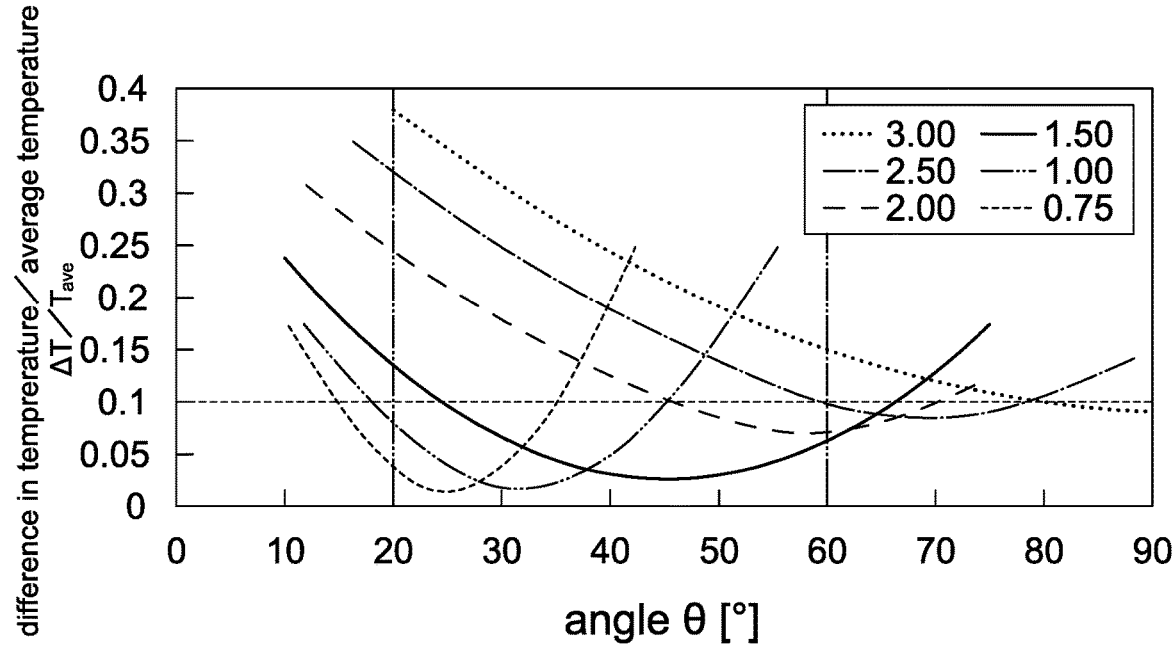
FIG. 7A is a graph showing a correlation characteristic between an angle and temperature distribution at each aspect ratio.

Next, the correlation characteristics between the angle θ and the temperature distribution for each aspect ratio (=Rd/Wd), which is the ratio of separation distance Wd to distance Rd, is explained. FIG. 7A is a graph indicating the correlation characteristic between the angle θ and temperature distribution at each aspect ratio, and FIG. 7B is a graph of plotted upper and lower limit values of the angle θ with respect to the separation distance Wd when $\Delta T/T_{ave}$ is less than 0.1 on the graph in FIG. 7A.

The graph in FIG. 7A has a vertical axis indicating a value obtained by dividing a difference ΔT between the largest value and the smallest value in temperature distribution on the substrate to be treated W1 by an average value $T_{ave}$ of the entirety of the temperature distribution, and a horizontal axis indicating the angle θ. The result shown in FIG. 7A are graphs obtained by simulation, and the respective aspect ratios are adjusted by changing the separation distance Wd in the optical heating device 1 as shown in FIG. 1.

Figure 7B:
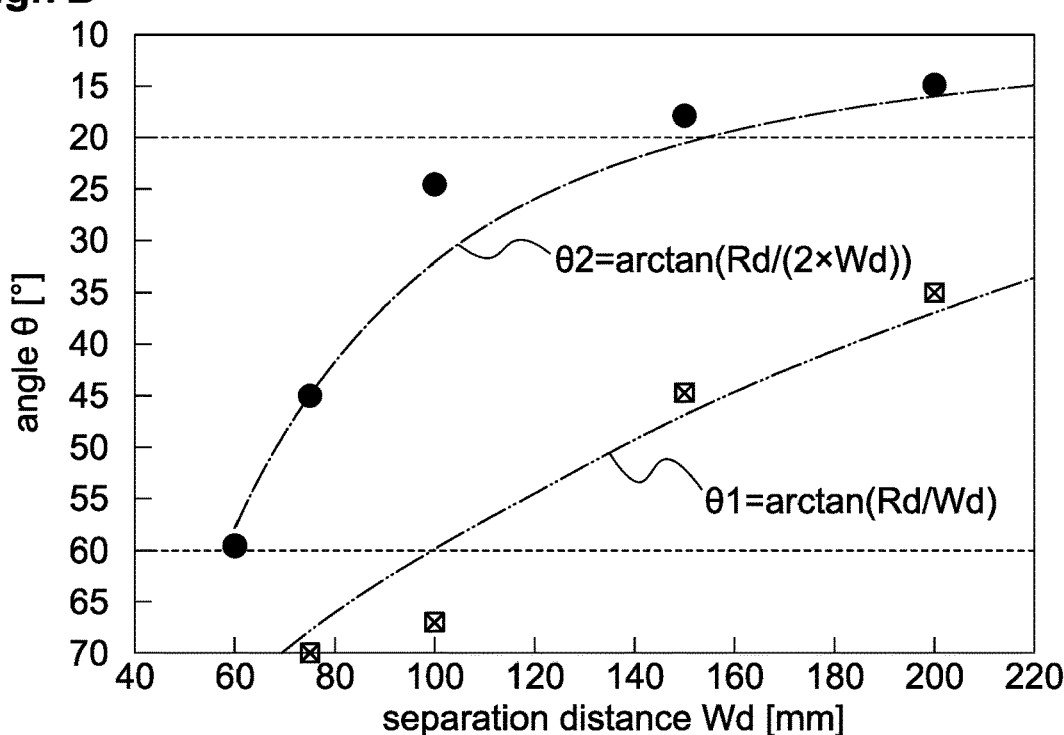
FIG. 7B is a graph of plotted upper and lower limit values of an angle θ when $\Delta T/T_{ave}$ is less than 0.1 on the graph in FIG. 7A.

The graph in FIG. 7B has a vertical axis indicating the angle θ, and a horizontal axis indicating the separation distance Wd. The plot of round dots shows the lower limit of angle θ when $\Delta T/T_{ave}$ is below 0.1, and the plot of square dots shows the upper limit of angle θ when $\Delta T/T_{ave}$ is below 0.1. In FIG. 7B, for convenience of explanation, the vertical axis is shown with a smaller value of angle θ as one moves upward. In FIG. 7B, the horizontal axis is indicated by the separation distance Wd, which corresponds directly to the aspect ratio, since Rd is fixed at 150 mm, as described above.

Specifically, the aspect ratios correspond respectively to 0.75 (Wd=200 mm), 1.00 (Wd=150 mm), 1.50 (Wd=100 mm), 2.00 (Wd=75 mm), 2.50 (Wd=60 mm), and 3.00 (Wd=50 mm).

As shown in FIG. 7A, the angle θ relevant to a minimum value of $\Delta T/T_{ave}$ increases as the aspect ratio increases. When the separation distance Wd is large, the light emitted from the LED element is irradiated onto the substrate to be treated W1 in a more spread-out state, so the minima appear in the range where the angle θ is relatively small. When the separation distance Wd is small, the larger the angle θ, the more light is irradiated over a wider area on the second main surface W1a of the substrate to be treated W1 to be treated, and the more uniform the heat treatment is, so the minima appear in the range where the angle θ is relatively large.

When the distance Rd is large (including a case where the distance Rd is larger than the radius of the substrate to be treated W1), if the angle θ is too small, light tends to concentrate on the peripheral edge of the substrate to be treated W1, and most of the heat generated at the peripheral edge is exhausted directly from the peripheral edge. The minima appear in the range where the angle θ is relatively large such that light can be irradiated to the center side of the substrate to be treated W1. When the distance Rd is small, the angle θ is set to be small, so that light is irradiated to the center side of the substrate to be treated W1, and the heat from the center side toward the peripheral side tends to make the heat treatment relatively uniform. Therefore, the minima appear in the range where the angle θ is relatively small.

When uniformity of temperature distribution with higher precision is required, such as in recent micro-processes in semiconductor manufacturing, there is a need for optical heating device that can perform heating treatment so that $\Delta T/T_{ave}$ is lower, and specifically, it is preferable that $\Delta T/T_{ave}$ is preferably 0.1 or less.

The region where $\Delta T/T_{ave}$ is less than 0.1 in the above angle θ range of 20° to 60° is when the aspect ratio is within the range shown in the above formula (2). To be sure, the above formula (2) is restated.

$$0.75 \leq Rd/Wd \leq 2.5 \qquad (2)$$

A condition for $\Delta T/T_{ave}$ to be less than 0.1 on the assumptions that the aspect ratio satisfies the above formula (2) is determined as follows according to FIGS. 7A and 7B.

In FIG. 7A, the condition for $\Delta T/T_{ava}$ to be less than 0.1 on the assumption that the aspect ratio satisfies the above formula (2) is derived from the approximate curves of the lower limit (single-dotted line) and upper limit (double-dotted line) at each separation distance Wd (aspect ratio), as shown in FIG. 7B, where the angle θ is θ1≤θ≤θ2. θ1 and θ2 can be expressed using the distance Rd and the separation distance Wd, respectively, from the positional relationship shown in FIG. 6A, and the relevant condition is the above formula (3). To be sure, the above formula (3) is restated.

$$\arctan(Rd/(2 \cdot Wd)) \leq \theta \leq \arctan(Rd/Wd) \qquad (3)$$

By configuring the optical heating device 1 to satisfy above formulae (1) to (3), the temperature difference of the entire substrate to be treated W1 during the heating treatment can be reduced.

As shown in FIG. 6A, θ1 corresponds to an angle between a virtual line s1 and the axis z2 passing through the center of the second main surface W1a of the substrate to be treated W1 in the Z direction. The virtual line s1 is a virtual line drawn from the center W1c of the second main surface W1a of the substrate to be treated W1 to the center 10c of the LED substrate 10b, as shown in FIG. 6A. As shown in FIG. 6B, θ2 corresponds to the angle between a virtual line s2 and the axis z2. As shown in FIG. 6b, the point W1h is the point on the substrate to be treated W1 that overlaps the midpoint of the line drawn from the center W1c of the substrate W1 to the center 10c of the LED substrate 10b when viewed from the Z direction. Then, as shown in FIG. 6A, the angle between the virtual line s2 drawn from point W1h to the center 10c of the LED substrate 10b and the axis z2 corresponds to θ2.

That is, the condition expressed by the above formula (3) according to the first embodiment corresponds to, when schematically depicted in correspondence with the configuration according to the first embodiment, a condition that a line passing, in a direction perpendicular to the first main surface 10p, the center 10c of the LED substrate 10b passes between the center W1c and the midpoint W1h of the substrate to be treated W1, as shown in FIG. 6A.

The optical heating device 1 with the above configuration can continuously adjust the illuminance distribution on the second main surface W1a of the substrate to be treated W1 by adjusting the angle between the first main surface 10p of the LED substrate 10b and the second main surface W1a of the substrate to be treated W1 and the direction in which the LED substrate 10b is tilted, in addition to adjusting the arrangement pattern of the LED element 10a group. This means that the optical heating device 1 can be adjusted continuously. In other words, the optical heating device 1 can adjust the illuminance distribution on the second main surface W1a of the substrate to be treated W1 more precisely than the conventional configuration.

Figure 8:
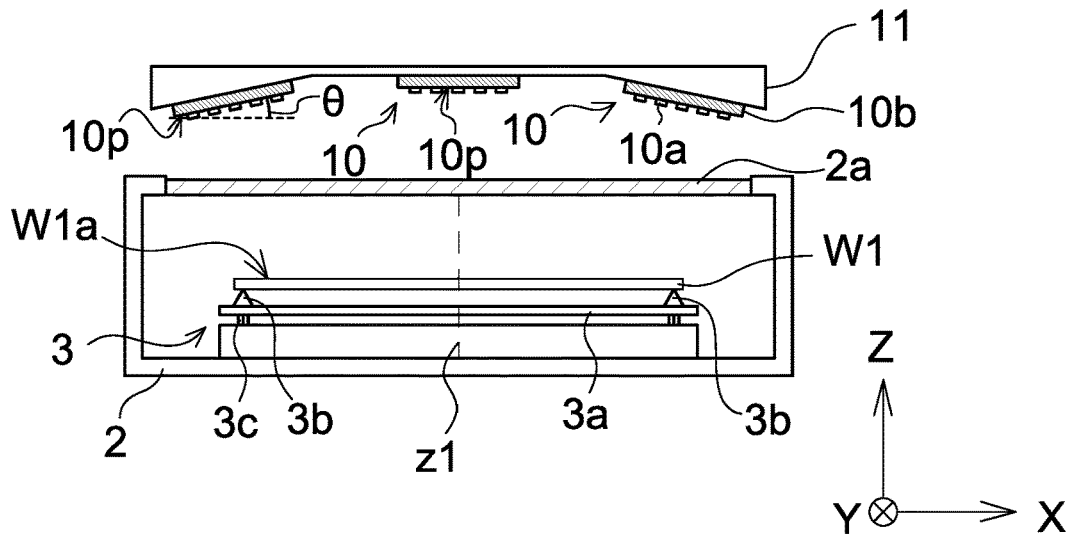
FIG. 8 is a schematic cross-sectional view in the Y direction, of an optical heating device according to another embodiment.

FIG. 8 is a schematic cross-sectional view in the Y direction, of an optical heating device according to an embodiment different from that of the optical heating device 1 shown in FIG. 1. As shown in FIG. 8, the frame 11 according to the first embodiment may not include the adjustment screw 11a or the support wall 11b, and may be configured to fix each of the light source units 10 at the predetermined angle θ.

The optical heating device 1 according to the above embodiment includes the frame 11 fixing the plurality of light source units 10, and the angle θ of each of the light source units 10 being fixed is set by the shape of the frame 11. The optical heating device 1 according to another embodiment may not include the frame 11 and may be configured to individually fix the light source unit 10 such that each of the light source units 10 has the predetermined angle θ at a predetermined position.

Furthermore, as shown in FIG. 1, the frame 11 in the first embodiment inclines the light source unit 10 by rotating the light source unit 10 by an angle θ with the Y axis as the rotation axis from the state where the first main surface 10p of the LED substrate 10b is aligned with the XY plane, but the rotation axis can be taken arbitrarily as long as the axis is parallel to the XY plane.

Furthermore, as shown in FIG. 8, the optical heating device 1 may partially include a light source unit 10 in which the first main surface 10*p* of the LED substrate 10*b* is parallel to the XY plane, i.e., the first main surface 10*p* and the second main surface W1*a* of the substrate to be treated W1 are parallel.

Second Embodiment

The configuration of the optical heating device 1 according to the second embodiment of the present invention will be described mainly on the points that differ from those of the first embodiment.

Figure 9:
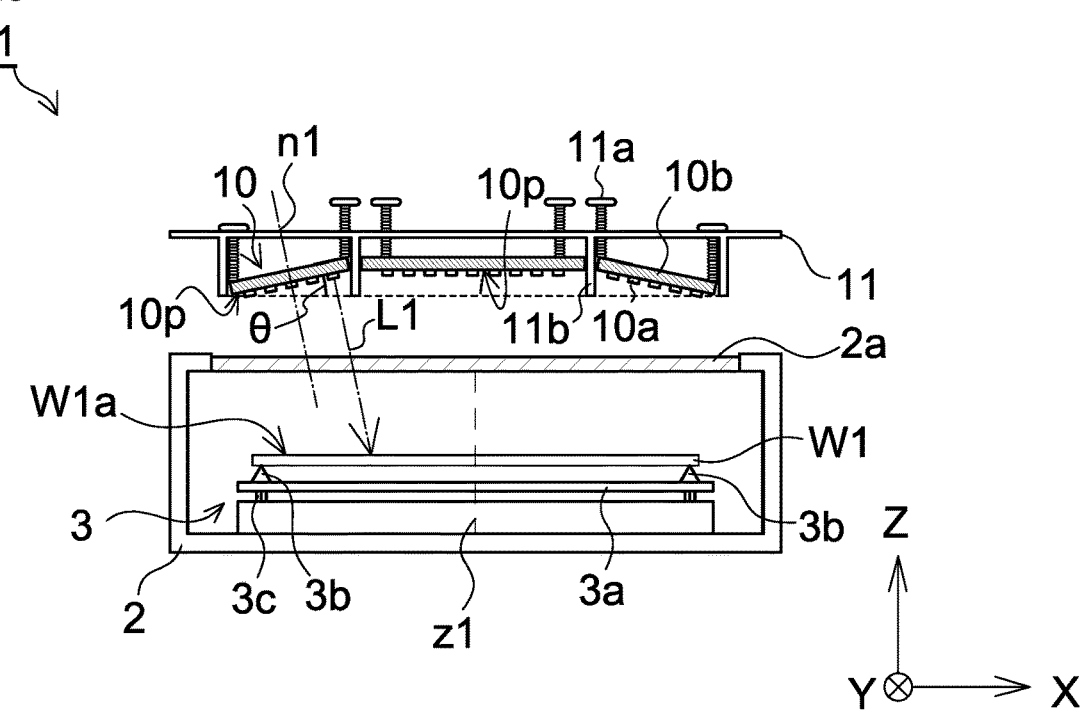
FIG. 9 is a schematic cross-sectional view in the Y direction, of an optical heating device according to still another embodiment.
Figure 10:
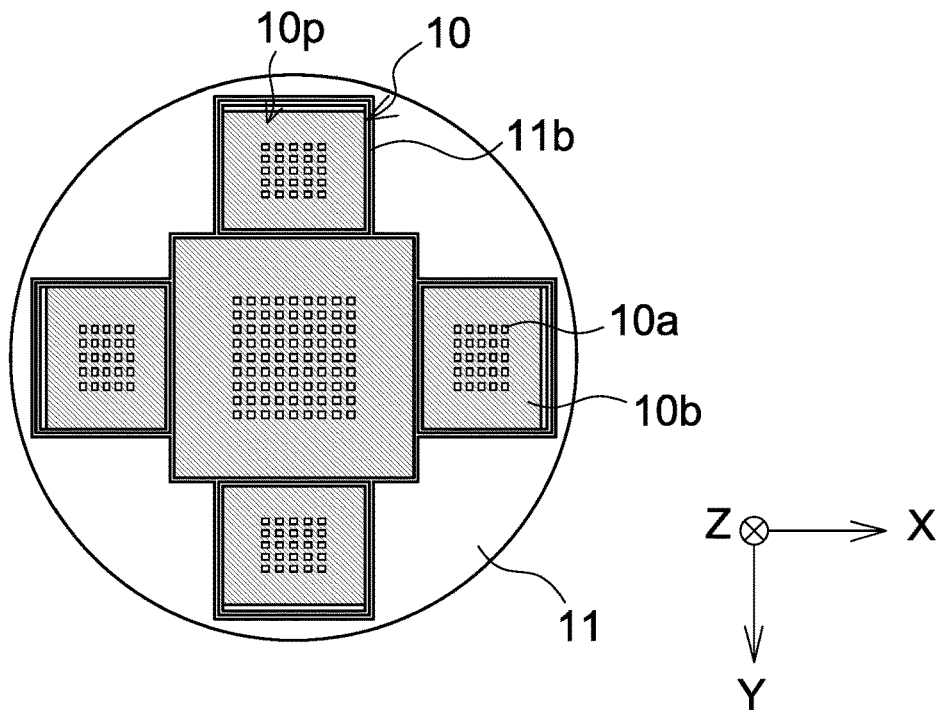
FIG. 10 is a view from the −Z side, of a frame shown in FIG. 9.
Figure 11:
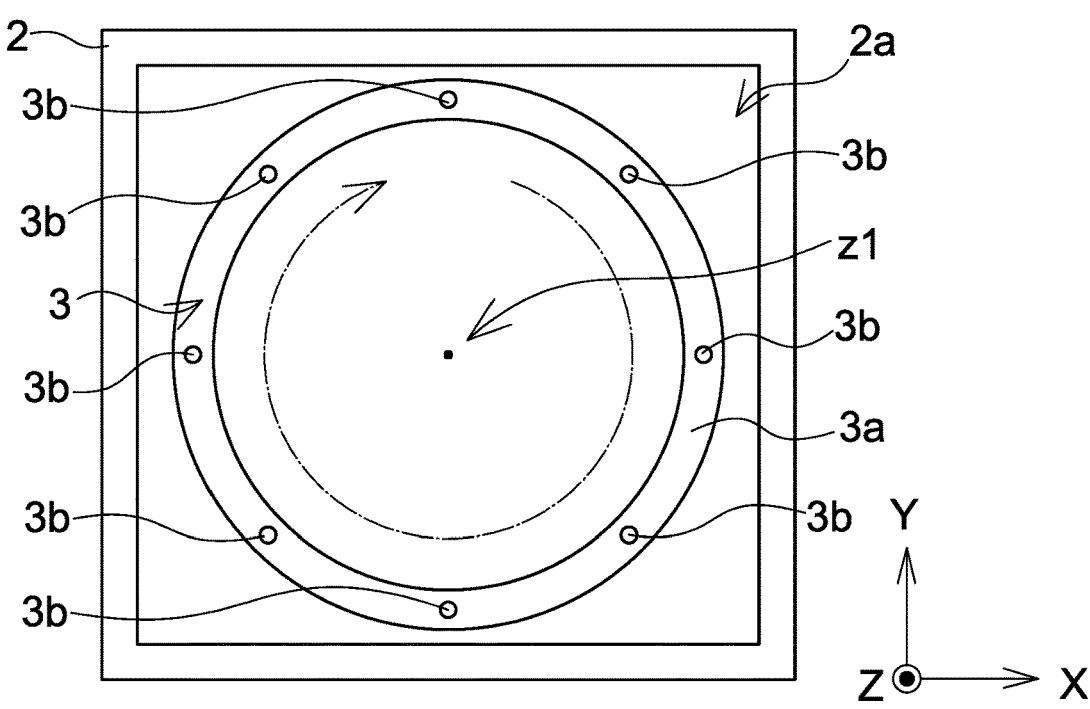
FIG. 11 is a view from the +Z side, of a chamber shown in FIG. 9.

FIG. 9 is a schematic cross-sectional view in the Y direction, of the optical heating device 1 according to the second embodiment. FIG. 10 is a view from the −Z side, of the frame 11 shown in FIG. 9, and FIG. 11 is a view from the +Z side, of the chamber 2 shown in FIG. 9. As shown in FIG. 9, the optical heating device 1 includes the chamber 2, the light source unit 10, and the frame 11, as in the first embodiment. In FIG. 11, the light transmissive window 2*a* is not hatched so that the structure inside chamber 2 can be seen.

The LED elements 10*a* included in each of the light source units 10 of the second embodiment emits infrared light with a peak wavelength of 850 nm. Each LED element 10*a* is arranged on the first main surface 10*p* of the LED substrate 10*b*. In the example shown in FIG. 9, the light source unit 10 includes a region where the first main surface 10*p* is parallel to the XY plane and a region where the first main surface 10*p* is inclined to the XY plane. The plurality of LED elements 10*a* is arranged in a direction parallel to the XY plane in a region where the first main surface 10*p* is parallel to the XY plane. The LED elements 10*a* may be arranged parallel to each side of the LED substrate 10*b*. In this case, the plurality of LED elements 10*a* is arranged in the X direction and the Y direction in the region where the first main surface 10*p* is parallel to the XY plane.

As shown in FIG. 10, in the second embodiment, the first main surface 10*p* of the LED substrate 10*b* is configured in a quadrilateral shape. However, the shape of the LED substrate 10*b* is arbitrary. Furthermore, the arrangement of the LED elements 10*a* on the LED substrate 10*b* may be adjusted according to the intended temperature distribution during the heat treatment of the substrate to be treated W1.

As shown in FIG. 9, the frame 11 in the second embodiment includes the adjustment screw 11*a* functioning as an angle adjusting mechanism configured to adjust the inclination angle θ of the LED substrate 10*b* in each of the light source units 10 to change the emission direction of light emitted from each of the LED elements 10*a*. The frame 11 is further provided with the support wall 11*b* preventing displacement upon adjusting the inclination of the LED substrate 10*b*.

As shown in FIG. 9, the frame 11 in the second embodiment is adjusted so that the first main surface 10*p* of the LED substrate 10*b* of the light source unit 10 placed on the center side by the adjustment screw 11*a* is parallel to the second main surface W1*a* (the XY plane) of the substrate to be treated W1. The frame 11 is adjusted so that the first main surface 10*p* of the LED substrate 10*b* of the light source unit 10 placed on the peripheral edge side is inclined by an angle θ to the second main surface W1*a* (the XY plane) of the substrate to be treated W1 by the adjustment screw 11*a*.

Figure 12:
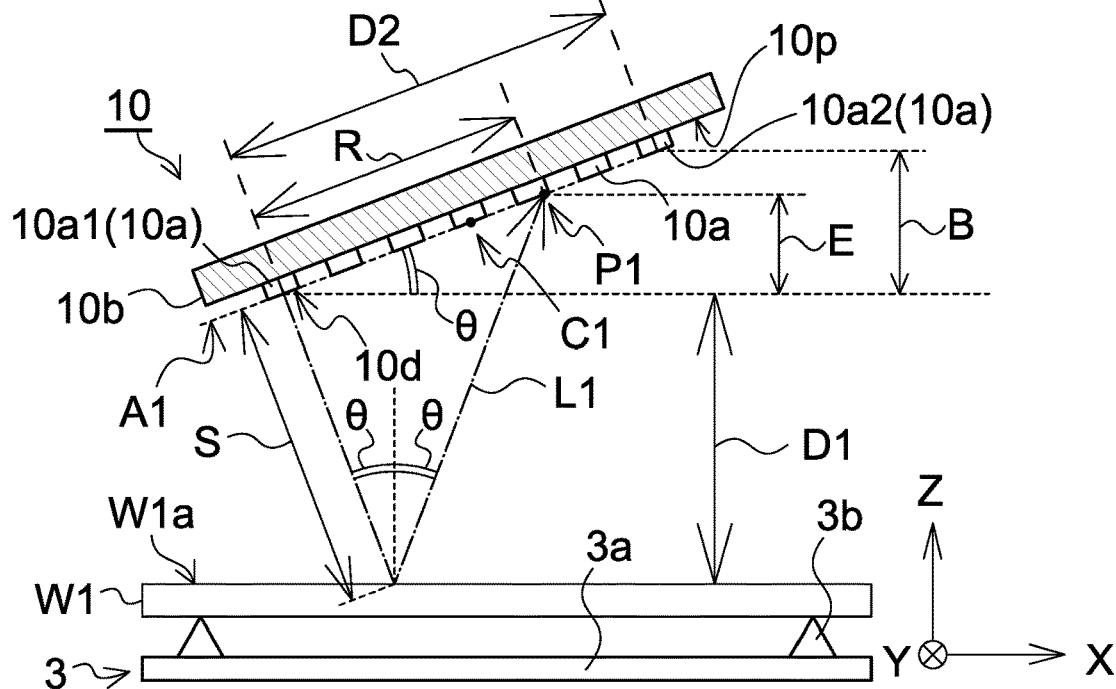
FIG. 12 is an explanatory schematic view of a configuration of a light source unit, and a disposition relationship between the light source unit and a substrate to be treated.

The conditions for the angle θ are explained below. FIG. 12 is an explanatory schematic view of a configuration of the light source unit 10, and a disposition relationship between the light source unit 10 and the substrate to be treated W1. For convenience of description, in the configuration shown in FIG. 12, the angle θ between the first main surface 10*p* and the second main surface W1*a*, the number of the LED elements 10*a* mounted on the LED substrate 10*b*, and the size ratio of the light source unit 10 to the substrate to be treated W1 are different from those shown in FIG. 9.

FIG. 12 shows a first LED element 10*a*1 positioned closest to the second main surface W1*a* in the Z direction among the plurality of LED elements 10*a* mounted on the LED substrate 10*b*. FIG. 12 also shows a second LED element 10*a*2 positioned farthest from the second main surface W1*a* in the Z direction among the plurality of LED elements 10*a* mounted on the LED substrate 10*b*. The LED substrate 10*b* is arranged so that the inclination angle θ satisfies the above formula (4) when the separation distance from the substrate to be treated W1 is D1 and the separation distance between the second LED element 10*a*2 and the first LED element 10*a*1 is D2. To be sure, the above formula (4) is restated.

$$2 \tan 2\theta / \cos \theta \geq D2/D1 \qquad (4)$$

The light source unit 10 in the second embodiment, specifically as to the first main surface 10*p* of the LED substrate 10*b* inclined from the second main surface W1*a*, the angle θ is set to 20.6°, the separation distance D2 is set to 16 mm, and the separation distance D1 is set to 40 mm.

The process of deriving the above formula (1) is explained below. In the explanation below, it is assumed that the principal ray L1 is not absorbed by the second main surface W1*a* of the substrate to be treated W1 and is reflected by it.

As shown in FIG. 12, The point where the principal ray L1 of light emitted from the first LED element 10*a*1 is reflected by the second main surface W1*a* of the substrate to be treated W1 and then intersects the plane A1 extending the light-emitting surface 10*d* of the LED element 10*a* is P1. The separation distance between the center of the light-emitting surface 10*d* of the first LED element 10*a*1 and the point P1 to the direction parallel to the main surface of the LED substrate 10*b* is R, and the separation distance between the center of the light-emitting surface 10*d* and point P1 in the Z direction is E. The separation distance between the first LED element 10*a*1 and the second LED element 10*a*2 in the Z direction is B.

As shown in FIG. 12, the principal ray L1 of light emitted from the first LED element 10*a*1 travels toward the substrate to be treated W1 (the −Z side) and then reaches the second main surface W1*a*. The distance traveled by the principal ray L1 from the first LED element 10*a*1 to reach the second main surface W1*a* of the substrate to be treated W1 is S.

The principal ray L1 is incident on the second main surface W1*a* at an incidence angle θ and is reflected on the second main surface at a reflection angle θ. The principal ray L1 then travels toward the light source unit 10 (the +Z side) and eventually reaches the point P1.

When it comes to the traveling distance S of the principal ray L1, the traveling distance of the principal ray L1 emitted from the first LED element 10*a*1 is the shortest. The closer the LED element 10*a* is to the second LED element 10*a*2, the longer the traveling distance of the principal ray L1 emitted from the LED element 10*a*. In other words, when viewed with respect to the X direction, the LED element 10*a* closer to the second LED element 10*a*2 has a longer distance traveled in the +X direction before reaching plane A1 after emitting from the LED element 10*a* and reflecting at the second main surface W1*a*.

According to the relationships described above, when the point P1 is located on the side of the second LED element 10*a*2 with respect to an intermediate point C1, the principal ray L1 of light emitted from the LED element 10*a* closer to the second LED element 10*a*2 reaches at least a region not provided with the LED elements 10*a* on the LED substrate 10*b*, as described above. That is, more than half of the light emitted from the LED element 10*a* and reflected from the second main surface W1*a* to the LED substrate 10*b* can be reflected to the outside of the LED substrate 10*b*, resulting in the LED element 10*a* being suppressed from being heated by the light reflected at the second main surface W1*a*.

The point P1 is located on the side of the second LED element 10*a*2 with respect to an intermediate point C1 under a condition expressed by the formula (5).

$$2E \geq B \qquad (5)$$

As shown in FIG. 12, the distance E, the distance R, and the angle θ have a relationship expressed as E=R×sin θ. Similarly, the distance B, the separation distance D2, and the angle θ have a relationship expressed as B=D2×sin θ. The formula (6) is obtained by substituting these relational expressions and rearranging the above formula (5).

$$2R \geq D2 \qquad (6)$$

Furthermore, As shown in FIG. 12, the distance R, the traveling distance S, and the angle θ have a relationship expressed as R=S×tan 2θ. The formula (7) is obtained by substituting this relational expression for the above formula (6).

$$2(S \times \tan 2\theta) \geq D2 \qquad (7)$$

Lastly as shown in FIG. 12, the traveling distance S, the separation distance D1, and the angle θ have a relationship expressed as S=D1/cos θ. The above formula (4) is obtained by substituting the relational expression and rearranging the formula (7).

The optical heating device 1 in the configuration described above, the principal ray L1 of light emitted from at least the LED element 10*a* disposed closer to the second LED element 10*a*2 than the first LED element 10*a*1 among the LED elements 10*a* mounted on the LED substrate 10*b* of the light source unit 10 is when being reflected on the second main surface W1*a* of the substrate to be treated W1, travels toward outside the region provided with the LED elements 10*a* on the LED substrate 10*b* of the light source unit 10, or toward outside the light source unit 10.

According to the above, the amount of light emitted from the LED element 10*a* of the light source unit 10, reflected by the second main surface W1*a* of the substrate to be treated W1, and returned to the LED element 10*a* again is reduced. Therefore, the LED element 10*a* mounted on the LED substrate 10*b* is suppressed from being heated by the light reflected on the second main surface W1*a* of the substrate to be treated W1.

The angle θ of the optical heating device 1 is calculated by measuring an inclination of the second main surface W1*a* of the substrate to be treated W1 and an inclination of the first main surface 10*p* of the LED substrate 10*b* with use of a level and comparing these inclinations. Alternatively, the angle θ of the optical heating device 1 can be calculated by measuring a distance from the first LED element 10*a*1 to the second main surface W1*a* of the substrate to be treated W1, a distance from the second LED element 10*a*2 to the second main surface W1*a* of the substrate to be treated W1, and a distance from the first LED element 10*a*1 to the second LED element 10*a*2.

The frame 11 in the second embodiment includes the adjustment screw 11*a* and the support wall 11*b*, as shown in FIG. 9, but may alternatively be configured to fix the LED substrate 10*b* at the predetermined angle θ without including the adjustment screw 11*a* or the support wall 11*b*. The angle adjusting mechanism may consist of, for example, a piezo actuator or a micrometer head with an encoder.

Figure 13:
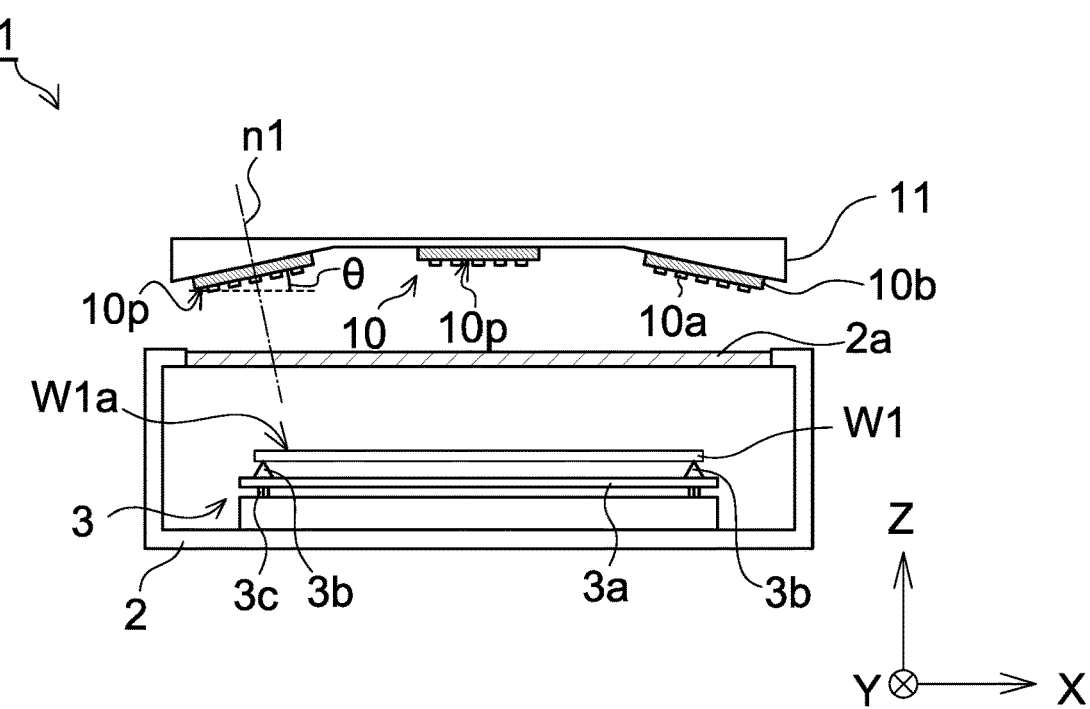
FIG. 13 is a schematic cross-sectional view in the Y direction, of an optical heating device according to another embodiment.
Figure 14:
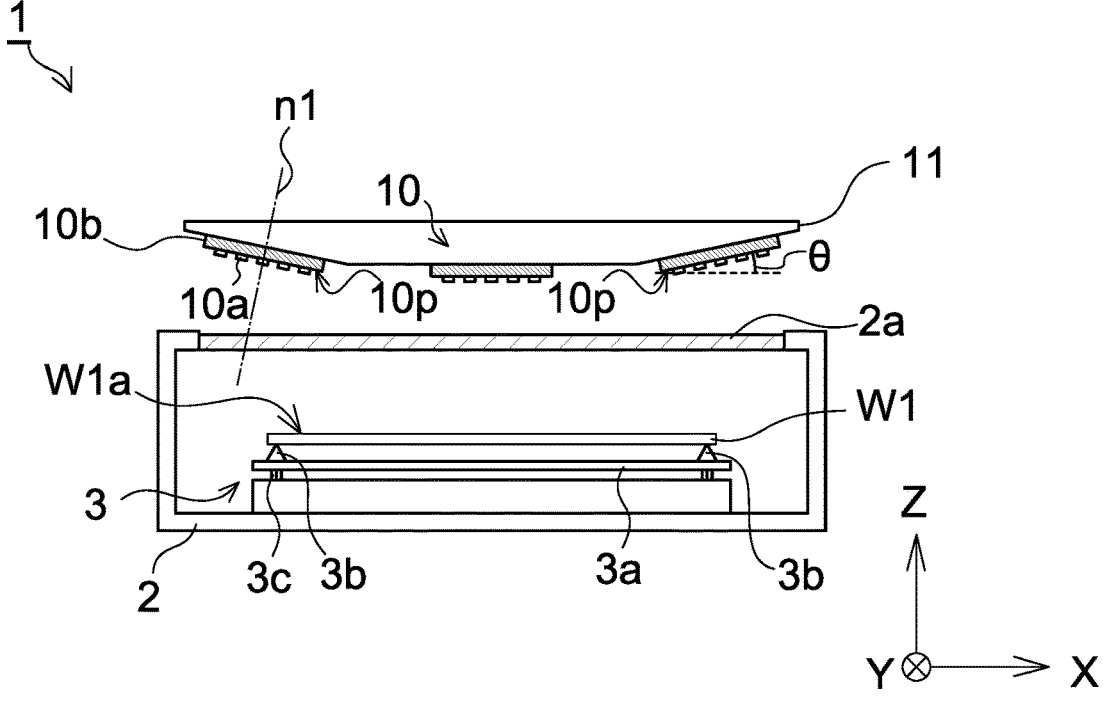
FIG. 14 is a schematic cross-sectional view in the Y direction, of an optical heating device according to another embodiment.
Figures 15, 16:
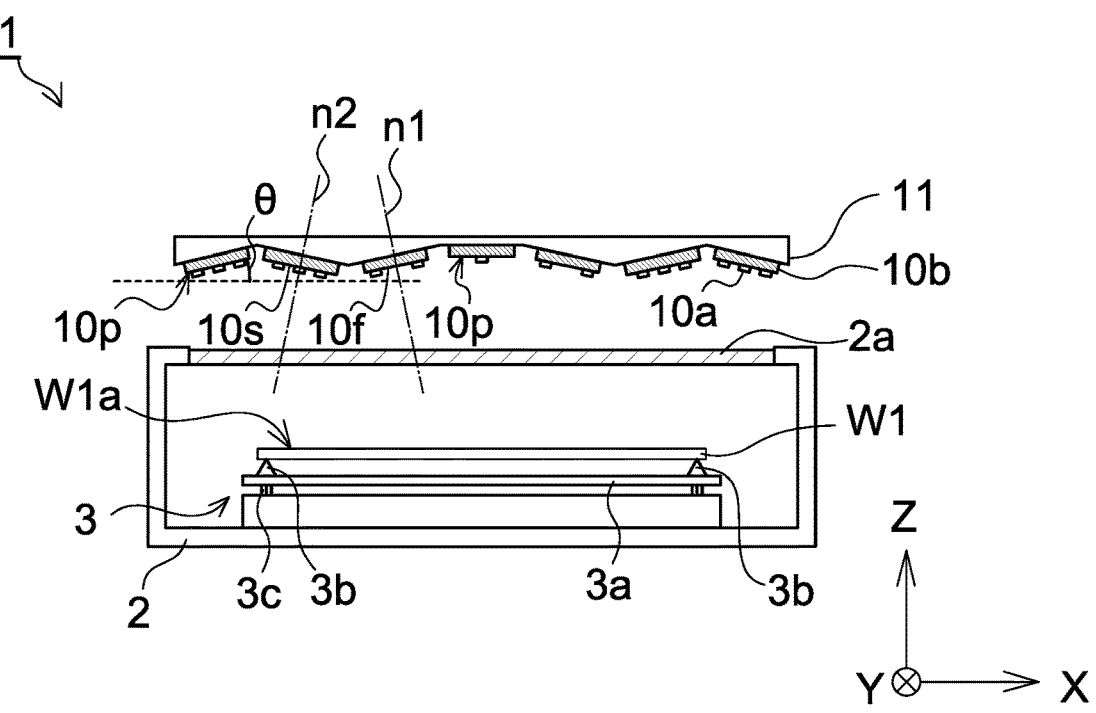
FIG. 15 is a schematic cross-sectional view in the Y direction, of an optical heating device according to another embodiment.
FIG. 16 is a schematic cross-sectional view in the Y direction, of an optical heating device according to another embodiment.

FIGS. 13 to 15 are schematic cross-sectional views in the Y direction, of an optical heating device according to an embodiment different from that of the optical heating device 1 shown in FIG. 9. As shown in FIGS. 13 to 15, the frame 11 in the second embodiment may not include the adjustment screw 11*a* or the support wall 11*b*, and may be configured to fix the LED substrate 10*b* at the predetermined angle θ.

In each of the embodiments described with reference to FIGS. 9 and 13, the LED substrate 10*b* is inclined such that the first main surface 10*p* has a normal line n1 extending toward the center side of the substrate to be treated W1 supported on the support member 3. As shown in FIG. 14, the LED substrate 10*b* may be inclined such that the normal line n1 extends toward the peripheral edge side of the substrate to be treated W1.

As shown in FIG. 15, the optical heating device 1 may include the LED substrate 10*b* (first LED substrate 10*f*) inclined such that the normal line n1 extends toward the center side of the substrate to be treated W1 as well as the LED substrate 10*b* (second LED substrate 10*s*) inclined such that a normal line n2 extends toward the peripheral edge side of the substrate to be treated W1. According to the configuration of the optical heating device 1 shown in FIG. 15, light can be intensively irradiated toward the vicinity of the peripheral edge of the substrate to be treated W1, which easily dissipates heat, and uneven heating of the entire substrate to be treated W1 can be suppressed.

In the configuration shown in FIG. 15, the LED substrate 10*b* placed on the center side of the frame 11 is adjusted to have fewer LED elements 10*a* than the LED substrate 10*b* placed on the peripheral edge side. This is due to the fact that the center side of the substrate to be treated W1 dissipates less heat than the peripheral edge side, and the light intensity required for the heat treatment is relatively small.

Other Embodiments

Other embodiments will be described.

<1> FIG. 16 is a schematic cross-sectional view in the Y direction, of the optical heating device 1 according to another embodiment. As shown in FIG. 16, the optical heating device 1 in another embodiment includes a controller 90, and a driving mechanism 11*c* functioning as an angle adjusting mechanism configured to change the position of the LED substrate 10*b* in accordance with a driving signal d2 outputted from the controller 90. The controller 90 according to the present embodiment includes an input unit 90*a*, a storage unit 90*b*, a determination unit 90*c*, and an output unit 90*d*.

The input unit 90*a* receives data d1 containing information on the substrate to be treated W1. The storage unit 90*b* stores a table of values of the separation distance Wd and the angle θ satisfying above formulae (1) to (3) and corresponding to the information on the substrate to be treated W1 contained in the data d1. The determination unit 90*c* refers to the information on the substrate to be treated W1 contained in the data d1 inputted to the input unit 90*a*, and determines the values of the angle θ and the separation distance Wd by the table stored in the storage unit 90*b*. The output unit 90*d* outputs the driving signal d2 to the driving mechanism 11*c* such that the angle θ between the first main surface 10*p* of the LED substrate 10*b* and the second main surface W1*a* of the substrate to be treated W1 and the separation distance Wd between the LED substrate 10*b* and the substrate to be treated W1 have the values determined by the determination unit 90*c*.

The optical heating device 1 in the above configuration may determine the angle θ and the separation distance Wd satisfying above formulae (1) to (3) by the information on the substrate to be treated W1 inputted to the controller 90, and adjust such that the LED substrate 10*b* is automatically disposed at an optimum position.

Furthermore, the optical heating device 1 in the above configuration may determine the angle θ satisfying the above formula (4) in accordance with the information on the substrate to be treated W1 inputted to the controller 90, and adjust such that the LED substrate 10*b* is automatically disposed at a most appropriate position.

The first main surface 10*p* in each of the above embodiments includes the LED substrate 10*b* disposed parallel to the second main surface W1*a* of the substrate to be treated W1. As shown in FIG. 16, the first main surface 10*p* of each of the LED substrates 10*b* may be inclined from the second main surface W1*a* of the substrate to be treated W1. Furthermore, the optical heating device 1 may additionally include a collimating lens corresponding to each of the LED elements 10*a*, an optical system such as a condensing lens, and the like to more effectively heat the peripheral edge of the substrate to be treated W1.

<2> The optical heating device 1 may include an angle sensor configured to measure the angle θ between the first main surface 10*p* and the second main surface W1*a*. The optical heating device 1 including such an angle sensor can adjust the disposition of the LED substrate 10*b* while checking whether or not the disposition of the LED substrate 10*b* satisfies above formulae (1) to (3) or formula (4).

The optical heating device 1 in the present embodiment can be configured to detect and alert the user when the LED substrate 10*b* is misaligned due to a large impact, or when the conditions in above formulae (1) through (3) or (4) above are no longer met.

For example, a rotary potentiometer or a rotary encoder can be employed as the angle sensor of the optical heating device 1 in this embodiment.

<3> The configurations of the optical heating device 1 described above, and the method for heating treatment are merely examples, and the present invention is not limited to the illustrated configurations.

What is claimed is:

1. An optical heating device that heats a substrate to be treated by irradiating light, the optical heating device comprising:

a support member supporting the substrate to be treated; and a light source unit including a plurality of LED substrates each having a first main surface on which a plurality of LED elements are mounted, wherein at least one of the plurality of LED substrates is arranged such that the first main surface is inclined to a second main surface of the substrate to be treated when the substrate to be treated is supported by the support member, each of the plurality of LED substrates are arranged so that an angle between the first main surface and the second main surface of the substrate to be treated is between 20° and 60° when the substrate to be treated is supported by the support member, and each of the plurality of LED substrates are arranged to satisfy formulae (1) to (3) below, wherein a distance between a center of the LED substrate at the first main surface and the substrate to be treated at the first main surface when the substrate to be treated is supported by the support member is Wd; a distance from a center of the substrate to be treated to the center of the LED substrate at the first main surface when viewed from a direction orthogonal to the second main surface of the substrate to be treated is Rd; an angle between the first main surface of the LED substrate and the second main surface of the substrate to be treated is θ, $$60 \text{ mm} \leq Wd \leq 200 \text{ mm} \tag{1}$$

$$0.75 \leq Rd/Wd \leq 2.5 \tag{2}$$

$$\arctan(Rd/(2 \cdot Wd)) \leq \theta \leq \arctan(Rd/Wd) \tag{3}.$$

2. An optical heating device that heats a substrate to be treated by irradiating light, the optical heating device comprising:

a support member supporting the substrate to be treated; and a light source unit including a plurality of LED substrates each having a first main surface on which a plurality of LED elements are mounted, wherein at least one of the plurality of LED substrates is arranged such that the first main surface is inclined to a second main surface of the substrate to be treated when the substrate to be treated is supported by the support member, and at least of the plurality of LED substrates is arranged to satisfy formula (4) below, wherein an angle between the first main surface and the second main surface of the substrate to be treated under a condition that the substrate to be treated is supported by the support member is θ, a separation distance between a first LED element located closest from the second main surface to a normal direction of the second main surface and the substrate is D1, a separation distance between a second LED element mounted on the LED substrate and the first LED element located farthest from the second main surface to the normal direction is D2, $$2 \tan 2\theta/\cos \theta \geq D2/D1 \tag{4}.$$

3. The optical heating device according to claim 2, wherein the light source unit includes a first LED substrate that is inclined such that a normal line of the first main surface from the light source unit toward the substrate to be treated is directed toward a center portion of the substrate to be treated under the condition that the substrate to be treated is supported by the support member, and a second LED substrate that is inclined to cause the normal line of the first main surface from the light source unit toward the substrate to be treated to be directed toward a peripheral edge of the substrate to be treated.

4. The optical heating device according to claim 2, further comprising an angle adjusting mechanism configured to adjust the angle θ by changing position of the LED substrate.

5. The optical heating device according to claim 4, further comprising a controller configured to determine a value of the angle θ based on the separation distance D1 and the separation distance D2, and drive the angle adjusting mechanism based on the determined the angle θ.

6. The optical heating device according to claim 2, further comprising an angle sensor configured to measure the angle θ between the first main surface and the second main surface.

7. The optical heating device according to claim 2, wherein the support member includes a rotation mechanism that rotates the substrate to be treated around an axis that is orthogonal to the second main surface and passes through a center of the second main surface.

8. A method of heating treatment is a heating treatment method in which a substrate to be treated supported by a support member is heated by irradiating light emitted from a light source unit including a plurality of LED substrates on which a group of LED elements are mounted on a first main surface of the substrate to be treated, the method comprising:

irradiating the substrate to be treated with heating light containing light emitted from the light source unit configured to satisfy formula (4) in a state where the substrate to be treated is supported by the support member, wherein θ is an angle between the first main surface and a second main surface of the substrate to be treated under a condition that the substrate to be treated is supported by the support member, D1 is a separation distance between a first LED element located closest from the second main surface to a normal direction of the second main surface and the substrate, D2 is a separation distance between a second LED element mounted on the LED substrate and the first LED element located farthest from the second main surface to the normal direction, $$2 \tan 2\theta / \cos \theta \geq D2/D1 \tag{4}$$

9. The method of heating treatment according to claim 8, further comprising determining the angle θ based on the separation distance D1 and the separation distance D2, and changing position of the LED substrate based on the determined the angle θ.

* * * * *